United States Patent
Jan et al.

(10) Patent No.: US 9,006,704 B2
(45) Date of Patent: Apr. 14, 2015

(54) MAGNETIC ELEMENT WITH IMPROVED OUT-OF-PLANE ANISOTROPY FOR SPINTRONIC APPLICATIONS

(75) Inventors: Guenole Jan, San Jose, CA (US); Ru Ying Tong, Los Gatos, CA (US); Witold Kula, Sunnyvale, CA (US); Cheng Horng, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 122 days.

(21) Appl. No.: 12/931,866

(22) Filed: Feb. 11, 2011

(65) Prior Publication Data

US 2012/0205758 A1    Aug. 16, 2012

(51) Int. Cl.

| H01L 33/04 | (2010.01) |
| H01L 29/66 | (2006.01) |
| H01L 43/08 | (2006.01) |
| H01L 43/10 | (2006.01) |
| H01L 43/12 | (2006.01) |
| G11C 11/16 | (2006.01) |
| H01F 10/32 | (2006.01) |
| H01F 41/30 | (2006.01) |

(Continued)

(52) U.S. Cl.
CPC .......... *H01L 29/66984* (2013.01); *H01L 29/82* (2013.01); *H01L 43/08* (2013.01); *H01L 43/10* (2013.01); *H01L 43/12* (2013.01); *G11C 11/16* (2013.01); *H01F 10/3254* (2013.01); *H01F 10/3286* (2013.01); *H01F 41/303* (2013.01); *H01F 10/1933* (2013.01); *B82Y 40/00* (2013.01)

(58) Field of Classification Search
CPC ...... H01L 43/08; H01L 27/222; H01L 27/228

USPC .............................. 257/421, 1, 9, 30, E29.323
See application file for complete search history.

(56) References Cited

U.S. PATENT DOCUMENTS

| 6,166,948 A | 12/2000 | Parkin et al. |
| 6,743,503 B1 | 6/2004 | Chen |

(Continued)

FOREIGN PATENT DOCUMENTS

WO    WO2009101827    8/2009

OTHER PUBLICATIONS

PCT Search Report PCT/US 12/24613 Mail date Jun. 2, 2012.
Co-pending US Patent HMG10-023, U.S. Appl. No. 12/927,939, filed Nov. 30, 2010, "Structure and Method for Enhacing Interfacial Perpendicular Anisotropy in CoFe(B)/MgO/CoFe(B) Magnetic Tunnel Junctions," assigned to the same assignee as the present invention, 43 pgs.

(Continued)

*Primary Examiner* — Minchul Yang
(74) *Attorney, Agent, or Firm* — Saile Ackerman LLC; Stephen B. Ackerman

(57) ABSTRACT

A magnetic element is disclosed wherein first and second interfaces of a free layer with a Hk enhancing layer and tunnel barrier, respectively, produce enhanced surface perpendicular anisotropy to lower switching current or increase thermal stability in a magnetic tunnel junction (MTJ). In a MTJ with a bottom spin valve configuration where the Hk enhancing layer is an oxide, the capping layer contacting the Hk enhancing layer is selected to have a free energy of oxide formation substantially greater than that of the oxide. The free layer may be a single layer or composite comprised of an Fe rich alloy such as $Co_{20}Fe_{60}B_{20}$. With a thin free layer, the interfacial perpendicular anisotropy may dominate the shape anisotropy to generate a magnetization perpendicular to the planes of the layers. The magnetic element may be part of a spintronic device or serve as a propagation medium in a domain wall motion device.

21 Claims, 5 Drawing Sheets

(51) Int. Cl.
   *B82Y 40/00*   (2011.01)
   *H01L 29/82*   (2006.01)
   *H01F 10/193*  (2006.01)

(56) References Cited

U.S. PATENT DOCUMENTS

| | | | |
|---|---|---|---|
| 6,834,005 | B1 | 12/2004 | Parkin |
| 6,847,510 | B2 | 1/2005 | Childress et al. |
| 6,974,708 | B2 | 12/2005 | Horng et al. |
| 7,335,961 | B2 | 2/2008 | Guo et al. |
| 7,742,263 | B2 | 6/2010 | Fukumoto et al. |
| 2007/0034919 | A1* | 2/2007 | Wang et al. .............. 257/295 |
| 2008/0278867 | A1* | 11/2008 | Fukumoto et al. ....... 360/324.12 |
| 2010/0072524 | A1 | 3/2010 | Huai et al. |
| 2011/0141796 | A1* | 6/2011 | Lee et al. ................. 365/158 |
| 2012/0023386 | A1 | 1/2012 | Oh et al. |

OTHER PUBLICATIONS

"Current-driven excitation of magnetic multilayers," by J.C. Slonczewski, Journal of Magnetism and Magnetic Materials 159 (1996) L1-L7, Elsevier.

"Growth, structure, electronic, and magnetic properties of MgO/Fe(001) bilayers and Fe/MgO/Fe(001) trilayers," by M. Klaua et al., Physical Review B, vol. 64, 134411, 2001 The American Physical Society, pp. 1-8.

"A perpendicular-anisotropy CoFeB—MgO magnetic tunnel junction," by S. Ikeda et al., nature materials, Letters published online: Jul. 11, 2010, DOI: 10.1038/NMAT2804, www.nature.com/naturematerials, pp. 1-4.

* cited by examiner

| Fe-rich Interface | Co-rich interface |
|---|---|
| Fe/Ag | Co/Ag |
| Fe/Au | Co/Au |
| Fe/Cr | Co/Cr |
| Fe/Cu | Co/Cu |
| Fe/GaAs | Co/GaAs |
| Fe/MgO | Co/MgO |
| Fe/Vacuum | Co/Si |
| Fe/Si | Co/SiO2 |
| Fe/SiO2 | Co/Al2O3 |
| Fe/Al2O3 | Co/V |
| Fe/Ta | Co/Ir |
|  | Co/Mo |
|  | Co/Os |
|  | Co/Ru |

FIG. 10

| Element | Oxide | Free energy of formation per mol of $O_2$ ($x10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

FIG. 11

MAGNETIC ELEMENT WITH IMPROVED OUT-OF-PLANE ANISOTROPY FOR SPINTRONIC APPLICATIONS

RELATED PATENT APPLICATION

This application is related to the following: Docket #HMG10-023, Ser. No. 12/927,939, filing date Nov. 30, 2010; which is assigned to a common assignee and is herein incorporated by reference in its entirety.

FIELD OF THE INVENTION

The invention relates to a magnetic element comprised of a free layer that interfaces with a tunnel barrier layer and a thin out-of-plane Hk enhancing layer thereby providing enhanced surface perpendicular anisotropy to reduce the perpendicular anisotropy field therein which lowers switching current for an in-plane magnetization embodiment, and increases thermal stability for a device with perpendicular to plane magnetization.

BACKGROUND OF THE INVENTION

Magnetoresistive Random Access Memory (MRAM), based on the integration of silicon CMOS with magnetic tunnel junction (MTJ) technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale.

Both field-MRAM and STT-MRAM have a MTJ element based on a tunneling magneto-resistance (TMR) effect wherein a stack of layers has a configuration in which two ferromagnetic layers are separated by a thin non-magnetic dielectric layer. One of the ferromagnetic layers has a magnetic moment that is pinned in a first direction while the other ferromagnetic layer has a magnetic moment which is free to rotate in a direction that is either parallel or anti-parallel to the first direction. As the size of MRAM cells decreases, the use of external magnetic fields generated by current carrying lines to switch the magnetic moment direction of the free layer becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic layer and non-magnetic spacer. Through this interaction, the electrons transfer a portion of their angular momentum to the ferromagnetic free layer. As a result, spin-polarized current can switch the magnetization direction of the ferromagnetic free layer if the current density is sufficiently high, and if the dimensions of the multilayer are small.

For STT-MRAM to be viable in the 90 nm technology node and beyond, the ultra-small MTJs (also referred to as nanomagnets) must exhibit a magnetoresistive (MR) ratio that is much higher than in a conventional MRAM-MTJ which uses a NiFe free layer and AlOx as the tunnel barrier layer. Furthermore, the critical current density (Jc) must be lower than about $10^6$ A/cm$^2$ to be driven by a CMOS transistor that can typically deliver 100 µA per 100 nm gate width. A critical current for spin transfer switching (Ic), which is defined as $[(Ic^+ + Ic^-)/2]$, for the present 180 nm node sub-micron MTJ having a top-down oval shaped area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgO, or the like. Thus, for high density devices such as STT-MRAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Several schemes have been presented to use the spin transfer torque mechanism for magnetic based memory such as STT-MRAM, or current induced domain wall motion based MRAM, logic, and sensor applications. Domain wall motion devices are described in U.S. Patent Application 2004/0252539 and WO 2009/101827. A preferred implementation is to employ a magnetic tunnel junction (MTJ) with a pinned ferromagnetic layer and free ferromagnetic layer separated by a tunneling oxide layer in a TMR configuration. This scheme has been widely studied for use as a memory element in MRAM or as a sensor in hard disk drive (HDD) heads.

Referring to FIG. 1, the two magnetic layers in a TMR configuration can either have their magnetization pointing in the plane or out of the plane of the film. An example of in-plane magnetization is shown on side (a) of FIG. 1 where a pinned layer 10 has a magnetic moment along an x-axis and the free layer 12 has a magnetic moment free to rotate in a (+) or (−) x-axis direction. An insulating (tunnel barrier) layer 11 separates the aforementioned two ferromagnetic layers. Out of plane magnetization is depicted on side (b) of FIG. 1 where pinned layer 20 has a magnetization pointing in a y-axis direction or perpendicular to the film plane and the free layer 21 has a magnetic moment that is free to rotate either in a (+) or (−) y-axis direction. In both examples, the free layer and pinned layer magnetizations are parallel or anti-parallel in a quiescent state. Thus, storage of the digital information is provided by the direction of magnetization in the free layer 12 (or 21).

When a memory element uses a free layer with a magnetic moment lying in the plane of the film, the current needed to change the magnetic orientation of a magnetic region is proportional to the net polarization of the current, the volume, magnetization, Gilbert damping constant, and anisotropy field of the magnetic region to be affected. The critical current ($i_c$) required to perform such a change in magnetization is given in equation (1):

$$i_c = \frac{\alpha eVMs}{g\hbar}\left[H_{k_{eff},\parallel} + \frac{1}{2}H_{k_{eff},\perp}\right] \quad (1)$$

where e is the electron charge, α is a Gilbert damping constant, Ms is the saturation magnetization of the free layer, $\hbar$ is the reduced Plank's constant, g is the gyromagnetic ratio, $H_{k_{eff}\parallel}$ is the in-plane anisotropy field, and $H_{k_{eff}\perp}$ is the out-ofplane anisotropy field of the magnetic region to switch, and V is the volume of the free layer. For most applications, the spin polarized current must be as small as possible.

The value $\Delta = kV/k_BT$ is a measure of the thermal stability of the magnetic element. If the magnetization lies in-plane, the value can be expressed as shown in equation (2):

$$\Delta = \frac{M_S V H_{k_{eff,\parallel}}}{2 k_B T} \quad (2)$$

where $k_B$ is the Boltzmann constant and T is the temperature.

Unfortunately, to attain thermal stability of the magnetic region, a large net magnetization is required which in most cases would increase the spin polarized current necessary to change the orientation of the magnetic region.

When the free layer has a magnetization direction perpendicular to the plane of the film as in FIG. 1(b), the critical current needed to switch the magnetic element is directly proportional to the perpendicular anisotropy field as indicated in equation (3):

$$i_c = \frac{\alpha e M_S V H_{k_{eff,\perp}}}{g\hbar} \quad (3)$$

The parameters in equation (3) were previously explained with regard to equation (1).

Thermal stability is a function of the perpendicular anisotropy field as shown in equation (4):

$$\Delta = \frac{M_S V H_{k_{eff,\perp}}}{2 k_B T} \quad (4)$$

In both of the in-plane and out-of-plane configurations represented in FIG. 1, the perpendicular anisotropy field of the magnetic element is expressed in equation (5) as:

$$H_{k_{eff,\perp}} = -4\pi M_s + \frac{2K_U^{\perp,s}}{M_s d} + H_{k,\chi,\perp} \quad (5)$$

where $M_s$ is the saturation magnetization, d is the thickness of the magnetic element, $H_{k,\chi,\perp}$ is the crystalline anisotropy field in the perpendicular direction, and $K_U^{\perp,s}$ is the surface perpendicular anisotropy of the top and bottom surfaces of the magnetic element. In the absence of strong crystalline anisotropy, the perpendicular anisotropy field of a magnetic layer is dominated by the shape anisotropy field ($-4\pi M_s$) on which little control is available. At a given thickness, lower magnetization saturation decreases shape anisotropy and the spin-polarized switching current but also decreases thermal stability which is not desirable. Therefore, an improved configuration for a magnetic element is needed that provides a decrease in spin-polarized switching current for a free layer with in-plane magnetization, and improved thermal stability for a free layer with perpendicular magnetic anisotropy.

Large uniaxial anisotropy with an easy axis perpendicular to the film surface for Fe films grown on a MgO surface is described by M. Klaua et. al in "Growth, structure, electronic, and magnetic properties of MgO/Fe(001) bilayers and Fe/MgO/Fe(001) trilayers" in Physical Review B, Vol. 64, 134411-1, (2001).

U.S. Pat. No. 6,743,503 describes a multilayer magnetic superlattice structure made of $(Co/Pt)_n$ or $(Co/Pd)_n$ which exhibits very high and controllable perpendicular magnetic coercivity when formed on an appropriate seed layer.

In U.S. Patent Application Pub. 2010/0072524, an oxide antiferromagnetic layer is employed between a free layer and a metal anti-ferromagnetic layer to decrease spin relaxation due to spin flip scattering and thereby reduce spin transfer torque switching current significantly.

U.S. Patent Application Pub. 2008/0278867 teaches an oxide diffusion barrier layer between a free layer and overlying top contact where the oxide diffusion barrier has an energy of oxide formation less than that of the top contact layer.

U.S. Pat. No. 6,166,948 discloses a free layer comprised of two ferromagnetic layers separated by a non-magnetic spacer so that the two ferromagnetic layers are magnetostatically coupled anti-parallel to each other through their respective dipole fields.

SUMMARY OF THE INVENTION

One objective of the present invention is to provide a magnetic element with a free layer having in-plane magnetization wherein critical switching current is lowered without degrading thermal stability or MR ratio in the magnetic device.

A second objective of the present invention is to provide a magnetic element wherein a free layer has out-of-plane magnetization, and enhanced interfacial perpendicular anisotropy is employed to improve thermal stability while maintaining a high MR ratio.

According to one embodiment, these objectives are achieved by providing a magnetic tunnel junction (MTJ) comprised of a pinned layer, a tunnel barrier layer, and a magnetic element including a free layer with a first surface that interfaces with the tunnel barrier, a Hk enhancing layer which interfaces with a second surface of the free layer, and a capping layer. The first and second surfaces are bottom and top surfaces, respectively, of the free layer in a bottom spin valve configuration. Both of the interfaces at the first and second surfaces exhibit strong perpendicular surface anisotropy. The free layer may be a single layer or a composite that is an alloy of Fe with one or more of Co, Ni, and B and with a thickness between 5 and 25 Angstroms. Preferably, the free layer is thin enough so that the perpendicular surface anisotropy field is significant compared with the shape anisotropy field. Furthermore, the free layer may be engineered such that the interfacial perpendicular anisotropy dominates the anisotropy field in an out-of-plane magnetization configuration also known as a perpendicular magnetic anisotropy (PMA) structure. In one aspect, the MTJ may have a bottom spin valve structure represented by seed layer/AFM layer/pinned layer/tunnel barrier/free layer/Hk enhancing layer/capping layer.

The Hk enhancing layer is made of any material that provides additional interfacial perpendicular anisotropy when contacting the free magnetic layer or the uppermost magnetic layer in a composite free layer embodiment. The Hk enhancing layer is formed on an opposite side of the free layer with respect to the tunnel barrier layer interface with the free layer. In a preferred embodiment, both of the tunnel barrier layer and Hk enhancing layer are made of MgO. In this case, the thickness and oxidation state of the MgO in the Hk enhancing layer are controlled to give a resistancexarea (RA) product smaller than that of the tunnel barrier layer to minimize the reduction in the magnetoresistive (MR) ratio. In an alternative embodiment, the Hk enhancing layer may be comprised of other oxides including SiOx, SrTiOx, BaTiOx, CaTiOx, LaAlOx, MnOx, VOx, AlOx, TiOx, and HfOx. In yet another embodiment, the Hk enhancing layer may be one of Ru, Ta, Ti, B, V, Mg, Ag, Au, Cu or Cr. Moreover, when the Hk enhancing layer is an oxide, the oxide may be embedded with conductive particles made of one or more of Fe, Co, Ni, Ru, Cr, Au, Ag, and Cu to lower the resistivity therein.

Preferably, the capping layer which is also referred to as the buffer layer is made of Ru. If the Hk enhancing layer is an oxide, it is important to select a buffer layer to have a free energy of formation substantially higher than that of the Hk enhancing layer so that the buffer layer does not change the oxidation state of the Hk enhancing layer during an anneal step. In other words, the metal selected for the buffer layer should not attract oxygen from an oxide Hk enhancing layer during an anneal step which would undesirably decrease the induced perpendicular anisotropy at the interface of the free layer and Hk enhancing layer.

Alternatively, the free layer may be formed below the tunnel barrier in a top spin valve structure represented by seed layer/Hk enhancing layer/free layer/tunnel barrier/pinned layer/AFM layer/capping layer. In this case, the seed layer is preferably Ru so that the seed layer has a free energy of oxide formation substantially less than that of a Hk enhancing layer comprised of an oxide.

BRIEF DESCRIPTION OF THE DRAWINGS

FIG. 10 is a table that illustrates suitable combinations of magnetic material/Hk enhancing layer to provide perpendicular interfacial anisotropy according to an embodiment of the present invention.

FIG. 11 is a table that lists the free energy of oxide formation for different materials.

DETAILED DESCRIPTION OF THE INVENTION

The present invention is based on the discovery that perpendicular surface anisotropy may be enhanced at multiple interfaces in a magnetic element to lower switching current and increase thermal stability. Although the exemplary embodiments depict a bottom spin valve configuration in a MTJ element, the present invention also encompasses a top spin valve design and dual spin valves as appreciated by those skilled in the art. The engineered magnetic element exhibiting enhanced perpendicular surface anisotropy may include a free layer in a TMR configuration. Furthermore, the engineered magnetic element may be employed in a MTJ as part of a STT-MRAM or other spintronic device, or as a propagation medium for a domain wall in a domain wall motion device. The terms interfacial perpendicular anisotropy and surface perpendicular anisotropy may be used interchangeably.

Figure 1A:
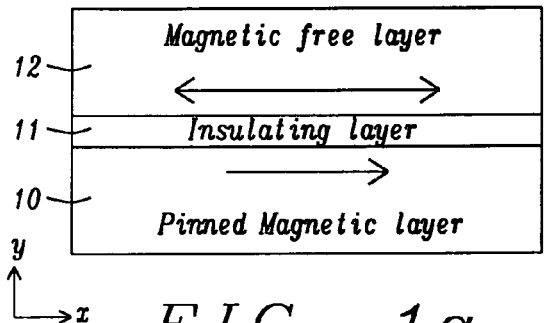
FIGS. 1a, 1b are cross-sectional views showing a magnetic tunnel junction (MTJ) with in-plane magnetization, and a MTJ with out-of-plane magnetization, respectively.
Figure 1B:
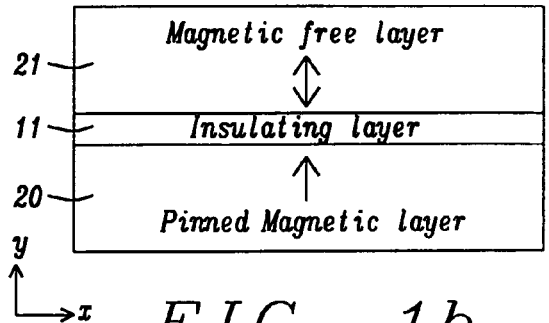

In a related patent application Ser. No. 12/927,939, we disclosed how Heff is reduced by incorporating a nanocurrent channel (NCC) layer in a CoFeB free layer and thereby enhancing interfacial perpendicular anisotropy Hk⊥ (interfacial). In addition, Hc and thermal stability Δ were observed to be larger for a dual NCC-MTJ than for a single NCC-MTJ at the same Bs. It is believed that based on equations (1) and (2) presented previously, the Hkeff⊥, and thus the perpendicular anisotropy field of a magnetic region is the likely candidate to be engineered to achieve low spin-polarized switching current without jeopardizing the thermal stability for a free layer having in-plane magnetization. Furthermore, there is a clear benefit in increasing perpendicular anisotropy in a perpendicular to plane free layer structure if one wants to increase thermal stability independently of the magnetic moment or volume even if the critical current is not decreased. Thus, for both of the in-plane and out-of-plane configurations represented in FIG. 1, it is desirable to increase the perpendicular anisotropy field of the magnetic element expressed in equation (5). Herein we disclose modifications of a magnetic element to further enhance interfacial perpendicular anisotropy at top and bottom surfaces of a free layer to lower switching current in an in-plane magnetization embodiment, and to increase thermal stability in an out-of-plane embodiment without significantly affecting other performance characteristics such as MR ratio.

Figure 2:
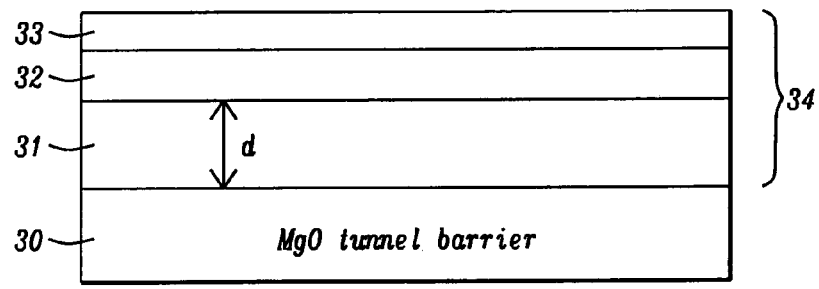
FIG. 2 is a cross-sectional view of a magnetic element wherein a free layer has a first interface with a tunnel barrier layer and a second interface with a Hk enhancing layer according to one embodiment of the present invention.

Referring to FIG. 2, one embodiment of the present invention is depicted. A magnetic element is shown comprised of a tunnel barrier layer 30 that may be MgO, for example. Above the tunnel barrier is consecutively formed a free magnetic layer 31, a Hk enhancing layer 32, and a capping layer 33. Thus, the engineered portion 34 of the magnetic element includes a first interface between the tunnel barrier 30 and a bottom surface of free layer 31, and a second interface formed between a top surface of the free layer and a bottom surface of Hk enhancing layer 32. In this context, a top surface is defined as one facing away from the tunnel barrier and a bottom surface is one facing the tunnel barrier. As a result of this configuration, there is strong perpendicular surface anisotropy ($K_{U1}^{\perp,s}$ in equation 5) at the first interface described above. Similarly, a material for the Hk enhancing layer 32 is chosen so that the second interface provides strong perpendicular surface anisotropy ($K_{U2}^{\perp,s}$). The total thickness d of the free magnetic layer 31 is thin enough so that the interfacial perpendicular anisotropy $(K_{U1}^{\perp,s}+K_{U2}^{\perp,s})/M_s d$ is significant compared with the shape anisotropy field. For example, the shape anisotropy field $4\pi Ms$ for a $Co_{20}Fe_{60}B_{20}$ free layer is approximately 12000 Oe. Depending on the composition of the engineered portion 34, we have found interfacial perpendicular anisotropy may be greater than 12000 Oe by maintaining thickness d in a range of 5 to 25 Angstroms. Under such conditions, an out-of-plane magnetization is established in the free layer. When interfacial perpendicular anisotropy is less than the magnitude of the shape anisotropy field, free layer magnetization remains in the plane of the free layer.

Preferably, the tunnel barrier 30 is made of MgO and is formed by a natural oxidation (NOX) process whereby a first Mg layer is deposited on the pinned layer and subsequently oxidized by a NOX method. Typically, the NOX process comprises an oxygen flow rate of 0.1 to 1 standard liters per minute (slm) for a period of 30 to 500 seconds and with an oxygen pressure from 0.05 to 1 torr. Thereafter, a second Mg layer is deposited on the MgO layer. A subsequent annealing step after the remaining MTJ layers are laid down essentially forms a uniform MgO tunnel barrier layer wherein the second Mg layer in the tunnel barrier stack is oxidized by oxygen diffusion from the underlying MgO layer and by gettering oxygen from the free layer 31. Optionally, the Mg deposition and NOX oxidation sequence may be repeated one or more times before the uppermost Mg layer is deposited on the tunnel barrier stack and subsequently oxidized during an anneal step. In an alternative embodiment, the tunnel barrier layer is made of $Al_2O_3$, TiOx, or HfOx. Furthermore, the tunnel barrier layer may be a laminate of one or more of the aforementioned oxides.

A key feature is that interfacial perpendicular anisotropy is established between oxide and magnetic metal. Thus, when a CoFe or CoFeB layer, which normally has in-plane magnetization, adjoins an oxide layer such as MgO, the magnetization of the CoFe or CoFeB layers can be aligned out-of-plane under conditions where interfacial perpendicular anisotropy exceeds the shape anisotropy field for the magnetic layer. Although a Fe rich CoFeB layer is preferred for a high MR ratio in a MgO/CoFeB tunnel barrier/free layer configuration, the present invention also anticipates that other alloys of Fe with one or more of Co, Ni, and B may be selected as the free layer 31. In an embodiment where the tunnel barrier is $Al_2O_3$, a Co rich alloy is preferred for the free layer.

Figure 4:
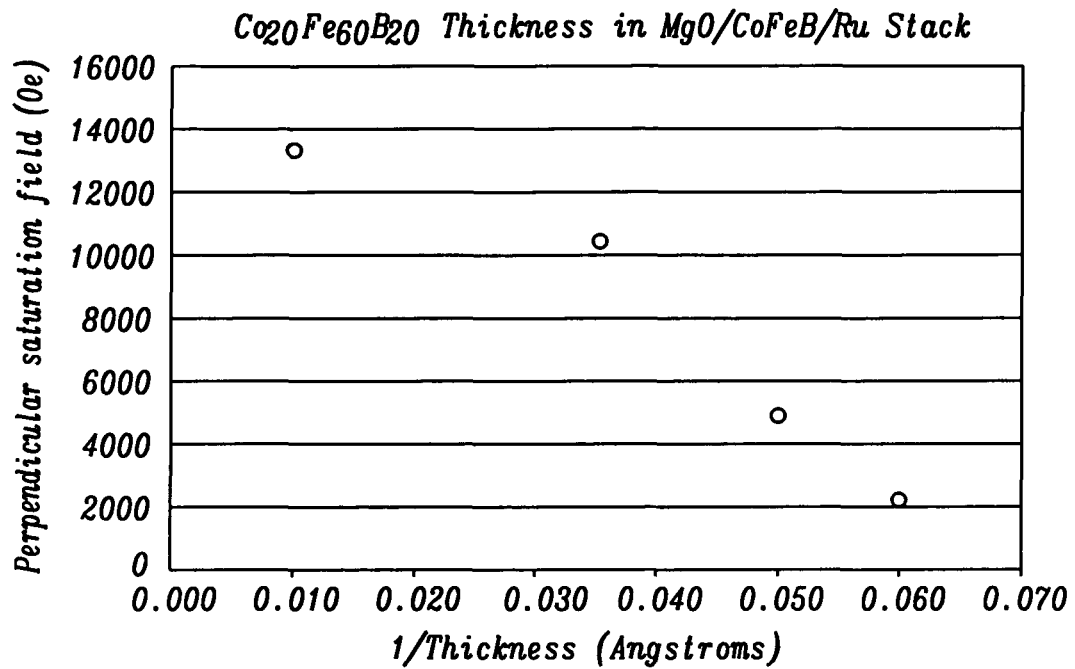
FIG. 4 is a plot that shows the measured perpendicular saturation field as a function of CoFeB layer thickness in a MgO/CoFeB/Ru configuration.

Referring to FIG. 4, the perpendicular saturation field of a $Co_{20}Fe_{60}B_{20}$ free layer that is sandwiched between MgO and Ru layers is illustrated for different free layer thicknesses. A thin layer of $Co_{20}Fe_{60}B_{20}$ and a 50 Angstrom thick Ru layer were sequentially sputter deposited on a MgO layer and subsequently annealed at 330° C. for 1 hour with a 10000 Oe applied field. Measurements were obtained by using a vibrating sample magnetometer and clearly indicate that surface perpendicular anisotropy at a MgO/CoFeB interface is responsible for a reduction in perpendicular saturation field at small CoFeB thicknesses. The MgO layer is about 10 Angstroms thick and was prepared by a NOX II sequence comprising deposition of a first Mg layer 6 Angstroms thick, performing a NOX process, depositing a second Mg layer 3 Angstroms thick and performing a second NOX process, and then depositing a third Mg layer. The third Mg layer is 3 Angstroms thick and is oxidized during the subsequent 330° C. anneal.

The present invention also encompasses an embodiment wherein the free layer is a composite comprised of two or more magnetic layers. In the exemplary embodiment depicted in FIG. 3, the composite free layer is comprised of a first magnetic layer 31 as described previously and a second magnetic layer 35 that may be comprised of one or more of Co, Ni, Fe, or an alloy thereof with B. For example, the first magnetic layer 31 may be CoFeB and the second magnetic layer 35 may be Co, Fe, CoFe, or another CoFeB layer with a different Fe content than in first magnetic layer 31. Preferably, total thickness d of the two magnetic layers 31, 35 is from 5 to 25 Angstroms. In this embodiment, the engineered portion 36 of the magnetic element has a configuration wherein first magnetic layer 31, second magnetic layer 35, Hk enhancing layer 32, and capping layer 33 are sequentially formed on a tunnel barrier layer that is preferably MgO. Strong surface perpendicular anisotropy is established at an interface between tunnel barrier layer 30 and first magnetic layer 31, and at an interface between a top surface of second magnetic layer 35 and a bottom surface of Hk enhancing layer 32.

Figure 3:
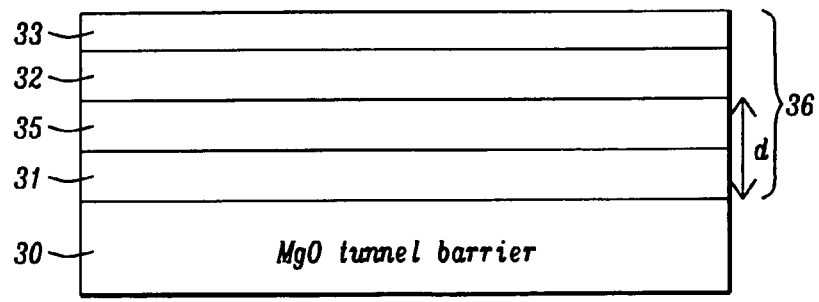
FIG. 3 is a cross-sectional view of a magnetic element wherein a composite free layer has a first interface with a tunnel barrier layer and a second interface with a Hk enhancing layer according to a second embodiment of the present invention.

In one aspect, the magnetic layer 31 in FIG. 2 and the magnetic layers 31, 35 in FIG. 3 have a magnetic moment in an in-plane direction. In an alternative embodiment, the free layer and Hk enhancing layer may be selected so that the interfacial perpendicular anisotropy dominates the shape anisotropy field. As a result, magnetization in magnetic layer 31 (FIG. 2) and in magnetic layers 31, 35 (FIG. 3) would be perpendicular to the plane of the layers which is a condition also known as perpendicular magnetic anisotropy (PMA). Preferably, in an embodiment with a composite free layer, both magnetic layers 31, 35 have a magnetic moment aligned in the same direction.

In all of the aforementioned embodiments, Hk enhancing layer 32 is made of a material that provides interfacial perpendicular anisotropy when contacting a top surface of magnetic layer 31 (FIG. 2), or a top surface of magnetic layer 35 in a composite free layer configuration as shown in FIG. 3. According to a preferred embodiment, the Hk enhancing layer 32 is comprised of MgO having a thickness and oxidation state that are controlled to give a resistance×area (RA) product smaller than that of the MgO layer in the tunnel barrier layer 30 in order to minimize a reduction in the MR ratio (TMR ratio in a TMR configuration). In an alternative embodiment, the Hk enhancing layer may be comprised of other oxides including SiOx, SrTiOx, BaTiOx, CaTiOx, LaAlOx, MnOx, VOx, AlOx, TiOx, or HfOx. In yet another embodiment, the Hk enhancing layer may be one of Ru, Ta, Ti, B, V, Mg, Ag, Au, Cu or Cr. Moreover, when the Hk enhancing layer 32 is an oxide, the oxide may be embedded with conductive particles made of one or more of Fe, Co, Ni, Ru, Cr, Au, Ag, and Cu to lower the resistivity therein. For instance, when the Hk enhancing layer is comprised of SiOx or $Al_2O_3$, the conductive particles may be 20% to 45% by weight of the Hk enhancing layer. The present invention also anticipates the Hk enhancing layer may be a laminate that includes a plurality of oxide layers comprised of one or more of the oxides described above.

Another important feature of the aforementioned embodiments is the material selected for the capping layer 33. In a preferred embodiment, the capping layer is made of Ru. Alternatively, other elements may be chosen for the capping layer. However, materials with a substantially higher free energy of oxide formation compared with the free energy of the oxide employed in the Hk enhancing layer 32 are most suitable. FIG. 11 lists the free energy of oxide formation of various elements. Note that if MgO is selected as the Hk enhancing layer, a capping layer material having a free energy of oxide formation substantially higher than −1146 kJ./mole is preferred. Thus, elements near the top of the table in FIG. 11 are preferred over elements near the bottom of the table since the former have a less negative value (higher energy of oxide formation) than the latter. It follows that Ta is less desirable than Ru as the capping layer since Ta has an affinity for oxygen close to that of Mg which means oxygen is more likely to migrate from the MgO Hk enhancing layer into a Ta capping layer than into a Ru capping layer during annealing. A loss of oxygen from an oxide Hk enhancing layer lowers the interfacial perpendicular anisotropy at the interface with the free layer thereby reducing the induced PMA in the free layer 31 (or 35). The largest advantage provided by a tunnel barrier layer/free layer/Hk enhancing layer/capping layer configuration according to the present invention occurs when the greatest amount of PMA is induced in the free layer as a result of the interfacial perpendicular anisotropy associated with the free layer interfaces mentioned previously. In an embodiment wherein the capping layer 33 is a composite as in Ru/Ta or Ru/Ta/Ru, the lowermost layer (not shown) contacting the Hk enhancing layer should have the high energy of oxide formation relative to an oxide Hk enhancing layer.

Figure 5:
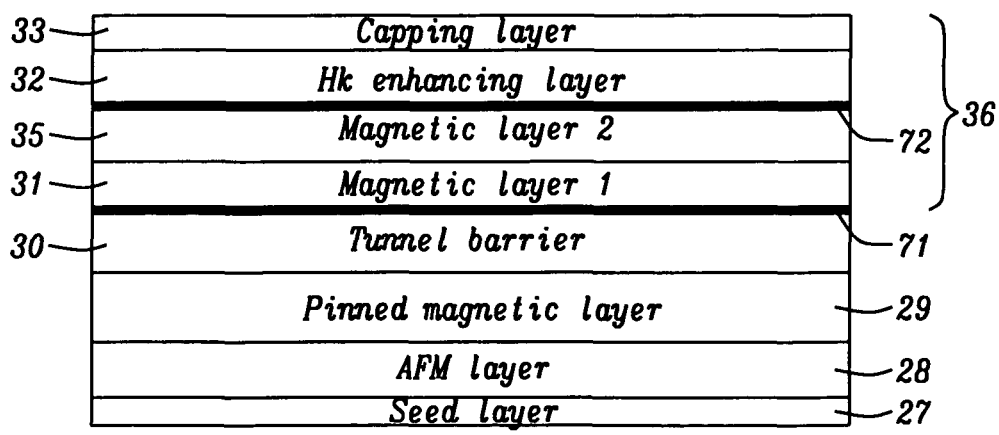
FIG. 5 is a cross-sectional view of a MTJ element formed according to a bottom spin valve embodiment of the present invention wherein interfaces with a tunnel barrier and Hk enhancing layer are formed at top and bottom surfaces of a composite free layer.

Referring to FIG. 5, an embodiment is shown where the magnetic element is part of a MTJ that has a bottom spin valve configuration. The MTJ may be formed on substrate such as a bottom electrode (not shown), and be comprised of a stack of layers represented by a seed layer/AFM layer/pinned layer/tunnel barrier/free layer/Hk enhancing layer/capping layer configuration. The seed layer 27 may be NiCr or other seed materials used in the art. The anti-ferromagnetic (AFM) layer 28 is used to pin the pinned layer magnetization direction and is preferably comprised of MnPt although IrMn, NiMn, OsMn, RuMn, RhMn, PdMn, RuRhMn, or MnPtPd are also acceptable. The pinned layer 29 may have a synthetic anti-ferromagnetic (SyAF) structure known as an AP2/coupling/AP1 configuration to improve thermal stability of the MTJ and also reduce the interlayer coupling Hin (offset) field applied to the free layer. In one embodiment, the AP2 and AP1 layers (not shown) are comprised of one or more of CoFe and CoFeB, and the coupling layer is made of Ru. The thickness of the AP2 layer and AP1 layer may be changed to adjust the Ho (offset field) to approximately 0 Oe.

In the exemplary MTJ embodiment depicted in FIG. 5, the free layer is a composite including a first magnetic layer 31 which forms a first interface 71 with the insulating layer (tunnel barrier) 30, and a second magnetic layer 35 that forms a second interface 72 with an overlying Hk enhancing layer 32. There is a capping layer 33 as the uppermost layer in the MTJ stack. The magnetic element according to one embodiment of the present invention includes magnetic layers 31, 35, Hk enhancing layer 32 and capping layer 33. An important consideration is that the first magnetic layer 31 and tunnel barrier layer 30 are chosen to exhibit the maximum amount of interfacial perpendicular anisotropy. Preferably, the tunnel barrier layer is MgO and the first magnetic layer is comprised of an Fe rich alloy with one or more of Co, Ni, and B such as $Co_{20}Fe_{60}B_{20}$ or $Co_{10}Fe_{70}B_{20}$ wherein the Fe content is 50 atomic % or greater. Likewise, the second magnetic layer and Hk enhancing layer are selected to provide the maximum amount of interfacial perpendicular anisotropy. Preferably, the Hk enhancing layer is made of MgO, TiOx, HfOx, or $Al_2O_3$, and the second magnetic layer is an Fe rich alloy with one or more of Co, Ni, and B such as $Co_{20}Fe_{60}B_{20}$ having a Fe content of 50 atomic % or greater. Alternatively, one or both of the first and second magnetic layers 31, 35 may be comprised of a Co rich alloy with one or more of Fe, Ni, and B wherein the Co content is about 50 atomic % or higher.

Figure 6:
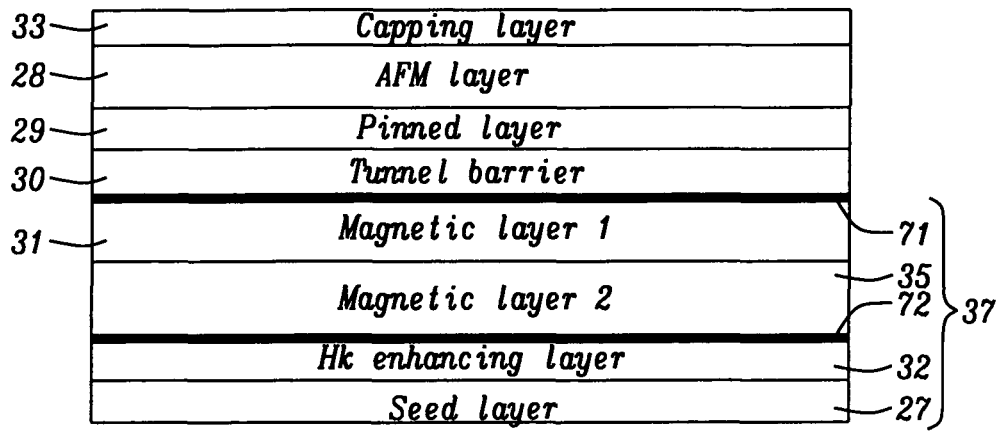
FIG. 6 is a cross-sectional view of a MTJ element formed according to an embodiment of the present invention wherein interfaces with a tunnel barrier and Hk enhancing layer are formed at top and bottom surfaces of a composite free layer in a top spin valve configuration.

In an alternative MTJ embodiment depicted in FIG. 6 that represents a top spin valve configuration, a magnetic element 37 as defined herein may be positioned below the tunnel barrier to give a seed layer/Hk enhancing layer/free layer/tunnel barrier/pinned layer/AFM layer/capping layer structure. For an embodiment with a composite free layer, there is a first interface 71 between the first magnetic layer 31 and tunnel barrier layer 30, and a second interface 72 between the second magnetic layer 35 and Hk enhancing layer 32 to produce a substantial amount of interfacial perpendicular anisotropy similar in magnitude to that in the bottom spin valve embodiment in FIG. 5. The top spin valve embodiment retains the same features with respect to the composition and properties of the tunnel barrier layer, free layer, and Hk enhancing layer as in the bottom spin valve embodiment. However, in this case, the seed layer 27 contacts a surface of the Hk enhancing layer that faces away from the second interface 72 with the free layer. The seed layer is made of a metal or alloy, preferably Ru, that has a free energy of oxide formation substantially greater than that of the oxide selected for the Hk enhancing layer. In an embodiment wherein the seed layer is a composite, the uppermost layer (not shown) contacting the Hk enhancing layer should have the high energy of oxide formation relative to that of an oxide Hk enhancing layer.

Referring to FIG. 10, a table is shown that lists additional examples of suitable pairs of magnetic layer/tunnel barrier layer or magnetic layer/Hk enhancing layer materials which generate a substantial amount of interfacial perpendicular anisotropy. Note that when an oxide is chosen for the Hk enhancing layer, the RA value may be reduced by lowering the oxidation state or doping the layer with conducting (magnetic or non-magnetic) impurities including one or more of Fe, Co, Ni, Ru, Cr, Au, Ag, and Cu which may be beneficial in MRAM or spintronic devices. Instead of the Fe or Co examples shown in the table, a Fe rich alloy or a Co rich alloy may be employed as the magnetic (free) layer portion of the suitable pairs.

Figure 7:
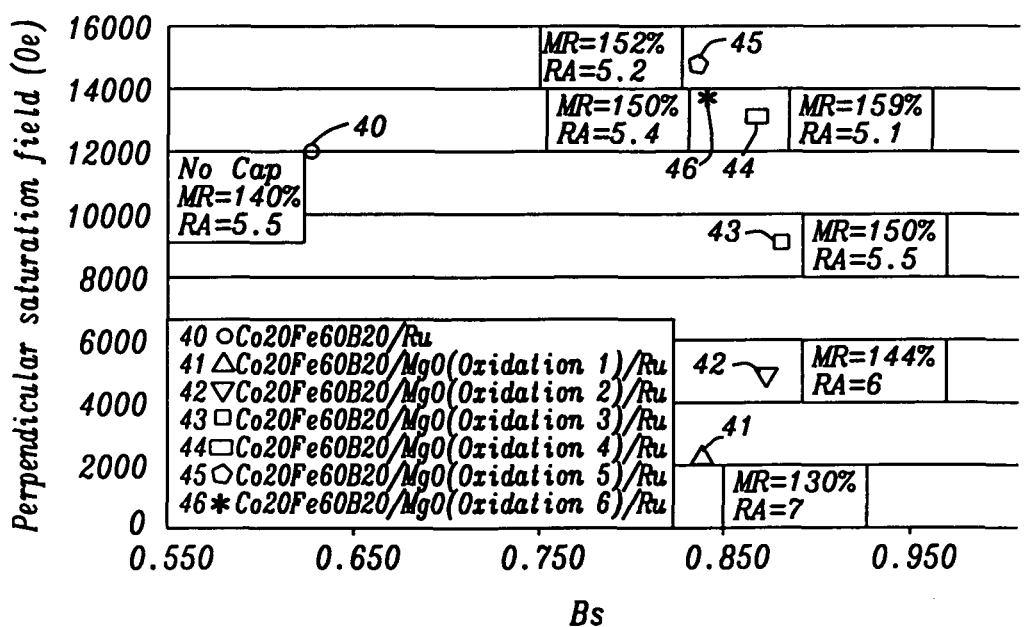
FIG. 7 is a plot showing that increasing the oxidation state (higher RA) in a Hk enhancing layer made of MgO reduces the perpendicular saturation field in a CoFeB/MgO configuration according to an embodiment of the present invention.

Referring to FIG. 7, measurements show a dramatic reduction in perpendicular saturation field due to enhanced perpendicular anisotropy. In particular, the use of MgO as a Hk enhancing layer according to an embodiment of the present invention reduces the perpendicular saturation field compared with a conventional MTJ stack represented by a NiCr seed/MnPt AFM layer/(CoFe/Ru/CoFe) pinned layer/MgO tunnel barrier/$Co_{20}Fe_{60}B_{20}$ free layer/Ru capping layer configuration (data point 40). Furthermore, a higher oxidation state of the MgO Hk enhancing layer generates larger interfacial perpendicular anisotropy which in turn lowers the perpendicular saturation field. Results in FIG. 7 (41-46) are shown for a full MTJ stack including a NiCr seed, MnPt AFM layer, CoFe/Ru/CoFe pinned layer, MgO tunnel barrier, and a $Co_{20}Fe_{60}B_{20}$/MgO/Ru free layer/Hk enhancing layer/capping layer magnetic element according to an embodiment of the present invention. The $Co_{20}Fe_{60}B_{20}$ layer is 20 Angstroms thick. Oxidation state progressively increases from data point 46 (oxidation 6) to data point 41 (oxidation 1). Generally, the perpendicular saturation field and MR ratio decrease as oxidation state increases. However, MR ratio is still maintained at elevated levels similar to the reference data point 40 even with RA values in the range of 5.5 to 6 (points 42, 43). Meanwhile, there is over a 50% reduction in perpendicular saturation field when comparing data point 42 to reference point 40. When RA is increased to 7 (data point 41), the perpendicular saturation field is further reduced but with a sacrifice of a slightly lower MR ratio compared with the reference. Note that the RA value for points 41-46 represents an additive contribution from both MgO layers. MgO tunnel barrier (MgO 1) contributes a RA value of 5 to 5.5 and the MgO Hk enhancing layer (MgO 2) contributes a lesser RA value of up to RA=2 in the $RA_{(MgO\ 1+MgO\ 2)}=7$ example (point 41).

As indicated earlier, the RA value is also dependent on thickness of an oxide (MgO) layer. Therefore, a certain RA value may be achieved by adjusting one or both of MgO thickness and oxidation state. In general, RA value may be lowered by decreasing one or both of MgO thickness and oxidation state. In this experiment (FIG. 7), the MgO 1 layer was prepared by a NOX II sequence as described earlier while the MgO 2 layer was prepared by depositing a first Mg layer with a 4.5 Angstrom thickness, performing an NOX process, and then depositing a second Mg layer having a 3 Angstrom thickness. Therefore, the MgO 2 layer thickness is less than that of the MgO 1 layer to generate a lower RA value for the MgO 2 layer of less than about 2. Note that a lower oxidation state may be achieved by using a shorter oxidation time or a lower $O_2$ flow rate when oxidizing one or more Mg layers in a NOX process sequence described earlier. Following annealing at 330° C. for 1 hour (ex-situ), an essentially uniform MgO Hk enhancing layer about 10 Angstroms thick is formed on the CoFeB layer. A relatively thick CoFeB free layer thickness was used (FIG. 7) to keep free layer magnetization in-plane. According to an embodiment of the present invention that relates to a tunnel barrier/free layer/Hk enhancing layer/capping layer configuration, a capping layer such as Ru is selected from the table in FIG. 11 to minimize a reduction in the MR ratio.

Figure 8:
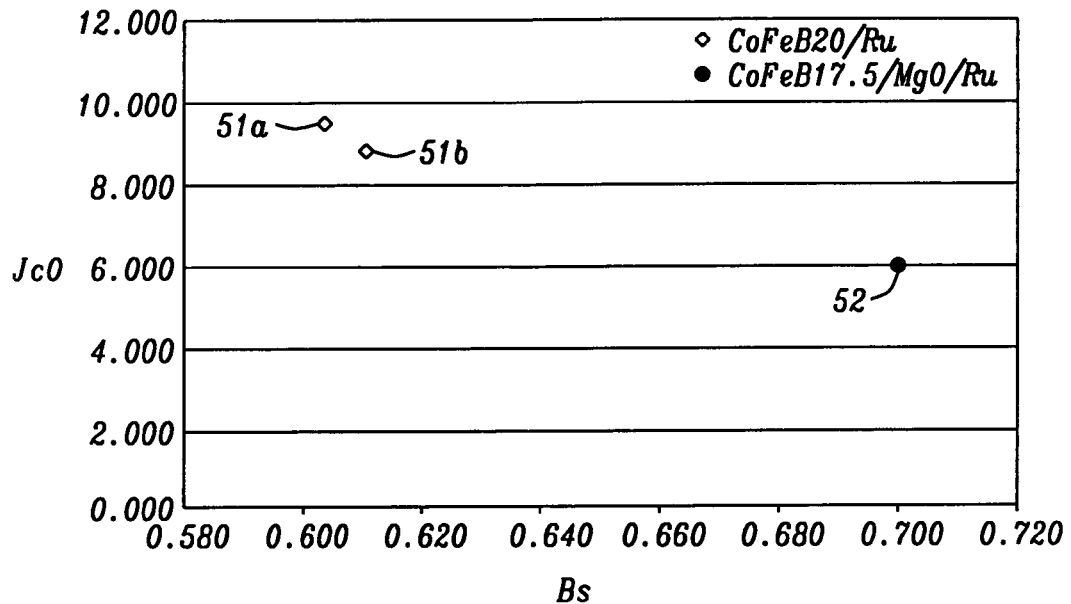
FIG. 8 is a plot depicting the switching current as a function of the magnetic moment in a free layer as measured using a BH looper.

Referring to FIG. 8, measurement of the switching current in milliamps/$cm^2$ for MTJ devices is plotted as a function of the free layer magnetic moment and shows that the reduction in perpendicular anisotropy field translates into a reduction of the spin-polarized current required to switch the magnetic element magnetization direction. The use of MgO as a Hk enhancing layer in the $Co_{20}Fe_{60}B_{20}$/MgO/Ru in-plane magnetization configuration has a critical current density (Jc0) at data point 52 less than that of a conventional $Co_{20}Fe_{60}B_{20}$/Ru free layer/capping layer configuration represented by data points 51a, 51b. Moreover, the $Co_{20}Fe_{60}B_{20}$/MgO/Ru configuration according to the present invention has a higher Bs which means higher thermal stability for the magnetic element is achieved. Thus, the data in FIGS. 7, 8 demonstrate that critical current density is lowered and higher thermal stability is realized without sacrificing MR ratio by employing a magnetic element according to an embodiment of the present invention wherein the free layer has in-plane magnetization.

Figure 9:
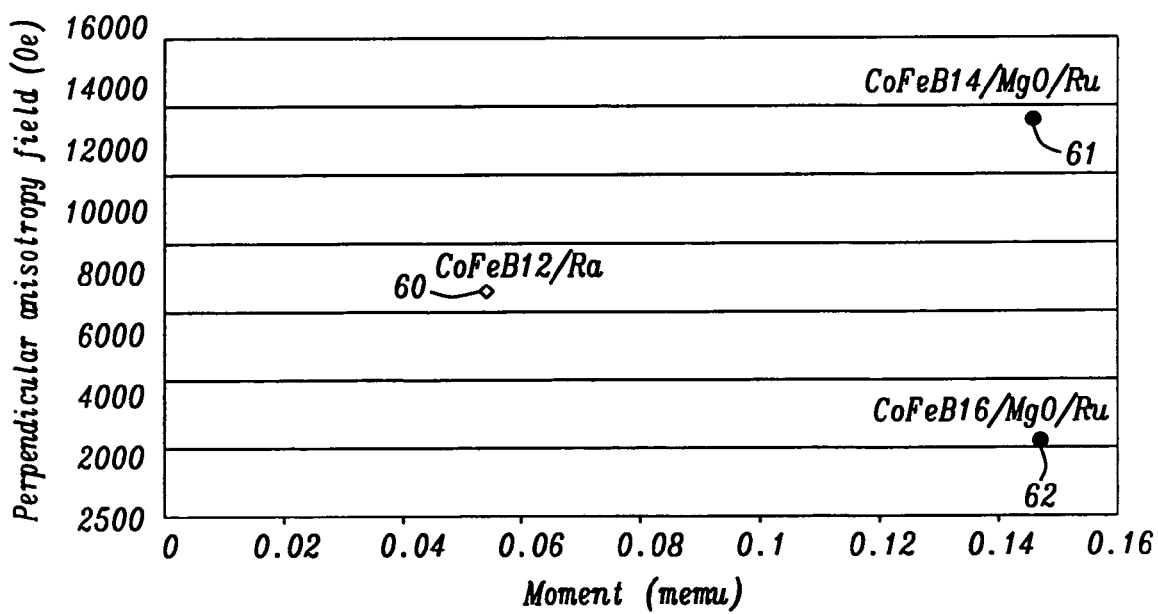
FIG. 9 is a plot of perpendicular Hk as a function of the magnetic moment in a magnetic structure.

In FIG. 9, results are shown for an embodiment where interfacial perpendicular anisotropy dominates the total anisotropy field in the free layer such that the free layer magnetization direction is perpendicular to the plane of the free layer. The samples used to generate data points 61, 62 and representing an embodiment of the present invention were prepared by sequentially forming a NiCr seed layer, MnPt AFM layer, CoFe/Ru/CoFe pinned layer, MgO tunnel barrier, a $Co_{20}Fe_{60}B_{20}$ free layer, a MgO Hk enhancing layer, and a Ru capping layer on an AlTiC substrate in a sputter deposition tool followed by annealing at 330° C. for 1 hour with an applied field of 10000 Oe similar to the full MTJ stack fabricated for FIGS. 7, 8. The only significant difference is that the CoFeB free layer is thinner (14-16 Angstroms thick) compared with a 17.5 Angstrom thick CoFeB free layer in the previous in-plane embodiment to enable the enhanced interfacial perpendicular anisotropy field to dominate the shape anisotropy field. The reference structure used for data point 60 has a conventional NiCr/MnPt/CoFe/Ru/CoFe/MgO/$Co_{20}Fe_{60}B_{20}$ free layer/Ta capping layer configuration and was annealed at the same conditions as indicated above. Note that the novel structure provides essentially the same perpendicular anisotropy field as the prior art structure but affords a substantially higher magnetic moment which translates into a higher thermal stability for the magnetic element based on a free layer with PMA which is beneficial in MRAM applications.

All layers in the magnetic elements 34, 36, 37, or in a MTJ including magnetic element 36 or 37 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. Once all of the layers in the magnetic elements 34, 36, 37 or in a MTJ comprising magnetic element 36 or 37 are laid down on a substrate, a high temperature annealing may be performed in a vacuum oven by applying a magnetic field of 5000 to 10000 Oe along the x-axis (easy axis) for 1 to 5 hours at a temperature of about 300° C. to 360° C. Thereafter, an array of MTJ elements with substantially vertical sidewalls may be fabricated by a process involving a conventional photolithography patterning and reactive ion etch (RIE) sequence as is well known in the art and will not be described herein. Subsequently, an insulation layer may be deposited to electrically isolate adjacent MTJ elements. A chemical mechanical polish (CMP) process is typically employed to form a smooth top surface of the insulation layer which becomes coplanar with a top surface of the MTJ array. Then additional metal levels such as a bit line layer may be formed on the MTJs to continue the fabrication of a magnetic device.

All of the embodiments described herein may be incorporated in a manufacturing scheme with standard tools and processes. In particular, a substantial gain in either thermal stability (perpendicular to plane embodiment) or a lower switching current (in-plane embodiment) is realized without sacrificing other performance characteristics such as MR ratio which is an important advantage in enabling 64 Mb and 256 Mb STT-MRAM technology, and other magnetic devices where low switching current, low RA value, high MR ratio, and high thermal stability are critical parameters.

While this invention has been particularly shown and described with reference to, the preferred embodiment thereof, it will be understood by those skilled in the art that various changes in form and details may be made without departing from the spirit and scope of this invention.

We claim:

1. A magnetic element exhibiting interfacial perpendicular anisotropy at first and second interfaces of a free layer with certain adjoining layers, comprising:

(a) a pinned layer formed on a substrate;
    (b) a tunnel barrier layer that adjoins a surface of the pinned layer;
    (c) the free layer having a bottom surface which forms a first interface with a surface of the tunnel barrier that faces away from the pinned layer, and having a top surface that forms a second interface with a Hk enhancing layer, the free layer is a composite of two CoFeB magnetic layers wherein a Fe content in a first CoFeB magnetic layer is different from a Fe content in a second CoFeB magnetic layer and has perpendicular magnetic anisotropy (PMA);
    (d) the Hk enhancing layer that provides interfacial surface anisotropy in the free layer along the second interface such that interfacial perpendicular anisotropy at the first and second interfaces dominates a shape anisotropy field within the free layer; and (e) a capping layer that adjoins a top surface of the Hk enhancing layer to give a stack of layers with a pinned layer/tunnel barrier/free layer/Hk enhancing layer/capping layer configuration.

2. The magnetic element of claim 1 wherein the tunnel barrier layer is one of MgO, $Al_2O_3$, TiOx, or HfOx or laminations of one or more of the aforementioned oxides.

3. The magnetic element of claim 1 wherein the free layer has a thickness from about 5 to 25 Angstroms.

4. The magnetic element of claim 1 wherein the Hk enhancing layer is a single layer or a laminate comprised of one or more oxides selected from MgO, SiOx, SrTiOx, BaTiOx, CaTiOx, LaAlOx, MnOx, VOx, AlOx, TiOx, and HfOx, and has a resistance×area (RA) value less than a RA value of the tunnel barrier layer.

5. The magnetic element of claim 4 further including particles comprised of one or more of Fe, Co, Ni, Ru, Cr, Au, Ag, and Cu that are embedded in the Hk enhancing layer.

6. The magnetic element of claim 4 wherein the capping layer has a free energy of oxide formation substantially greater than that of the oxide selected for the Hk enhancing layer.

7. The magnetic element of claim 6 wherein the tunnel barrier layer and Hk enhancing layer are made of MgO and the capping layer is Ru.

8. The magnetic element of claim 1 wherein the Hk enhancing layer is comprised of Ru, Ta, Ti, B, V, Mg, Ag, Au, Cu or Cr.

9. The magnetic element of claim 1 wherein the interfacial perpendicular anisotropy has a magnitude greater than about 12000 Oe, and a magnetization direction of the free layer is perpendicular to the top and bottom surfaces of said free layer.

10. The magnetic element of claim 1 wherein said layers (a)-(e) are part of a magnetic tunnel junction (MTJ) and an array of said MTJs are used for digital storage in a MRAM, spin transfer MRAM, or another spintronic device.

11. The magnetic element of claim 1 wherein the second CoFeB layer is Fe rich with a Fe content greater than or equal to 50 atomic %, and the Hk enhancing layer is made of MgO, TiOx, HfOx, or $Al_2O_3$.

12. A magnetic element exhibiting interfacial perpendicular anisotropy at first and second interfaces of a free layer with certain adjoining layers, comprising:

(a) a seed layer formed on a substrate;
(b) a Hk enhancing layer contacting a top surface of the seed layer;
(c) the free layer having a bottom surface that forms a second interface with a top surface of the Hk enhancing layer, and having a top surface that forms a first interface with a tunnel barrier layer, the free layer is a composite of two CoFeB magnetic layers wherein a Fe content in a first CoFeB magnetic layer is different from a Fe content in a second CoFeB magnetic layer and has perpendicular magnetic anisotropy (PMA) wherein the interfacial perpendicular anisotropy at the first and second interfaces dominates a shape anisotropy field of the free layer;
(d) the tunnel barrier layer; and
(e) a pinned layer that adjoins a top surface of the tunnel barrier layer to give a stack of layers with a seed layer/Hk enhancing layer/free layer/tunnel barrier/pinned layer configuration.

13. The magnetic element of claim 12 wherein the tunnel barrier layer is one of MgO, $Al_2O_3$, TiOx, or HfOx or laminations of one or more of the aforementioned oxides.

14. The magnetic element of claim 12 wherein the free layer has a thickness from about 5 to 25 Angstroms.

15. The magnetic element of claim 12 wherein the Hk enhancing layer is a single layer or a laminate comprised of one or more oxides selected from MgO, SiOx, SrTiOx, BaTiOx, CaTiOx, LaAlOx, MnOx, VOx, AlOx, TiOx, and HfOx, and has a resistance×area (RA) value less than a RA value of the tunnel barrier layer.

16. The magnetic element of claim 15 further including particles comprised of one or more of Fe, Co, Ni, Ru, Cr, Au, Ag, and Cu that are embedded in the Hk enhancing layer.

17. The magnetic element of claim 15 wherein the seed layer has a free energy of oxide formation substantially greater than that of the oxide selected for the Hk enhancing layer.

18. The magnetic element of claim 17 wherein the tunnel barrier layer and Hk enhancing layer are made of MgO and the seed layer is comprised of Ru.

19. The magnetic element of claim 12 wherein the Hk enhancing layer is comprised of Ru, Ta, Ti, B, V, Mg, Ag, Au, Cu or Cr.

20. The magnetic element of claim 12 wherein the interfacial perpendicular anisotropy of the free layer has a magnitude greater than about 12000 Oe such that a magnetization direction of the free layer is perpendicular to the top and bottom surfaces of said free layer.

21. The magnetic element of claim 12 wherein said layers (a)-(e) are part of a magnetic tunnel junction (MTJ) and an array of said MTJs are used for digital storage in a MRAM, spin transfer MRAM, or another spintronic device.

* * * * *